United States Patent

Dueker et al.

[11] 4,432,609
[45] Feb. 21, 1984

[54] RADIATION PROTECTION LOUVER

[75] Inventors: James E. Dueker, Florissant, Mo.; Ronald C. Foster, Fort Worth, Tex.; Bennett V. Whiteson, Wentzville, Mo.

[73] Assignee: The United States of America as represented by the Secretary of the Air Force, Washington, D.C.

[21] Appl. No.: 337,347

[22] Filed: Jan. 6, 1982

[51] Int. Cl.³ .............................................. E05F 15/20
[52] U.S. Cl. ...................................... 350/266; 16/48.5; 49/2; 126/419; 160/6
[58] Field of Search ........................ 126/419; 236/93 R; 16/48.5; 49/1, 2, 74; 160/1, 6; 165/13; 350/266

[56] References Cited

U.S. PATENT DOCUMENTS

| | | | |
|---|---|---|---|
| 3,768,754 | 10/1973 | Janes | 244/1 SC |
| 3,872,911 | 3/1975 | Janes | 160/1 |
| 3,889,314 | 6/1975 | McCabe | 49/2 |

OTHER PUBLICATIONS

William J. Buehler and Frederick E. Wang, "A Summary of Recent Research on the Nitinol Alloys and Their Potential Application in Ocean Engineering," Ocean Engineering, 105–120 (1968).

*Primary Examiner*—Bruce Y. Arnold
*Assistant Examiner*—William Propp
*Attorney, Agent, or Firm*—Donald J. Singer; Bobby D. Scearce

[57] ABSTRACT

An improved radiation protection louver system is described which comprises a movable louver panel hinged to a rotatable shaft through a thermally sensitive closure hinge member comprising a martensitic structure alloy exhibiting the characteristic of changing its shape from an intermediate configuration to a predetermined configuration in response to exposure to high intensity radiation. Motor drive means is included to reshape the hinge to the desired intermediate configuration following a temperature excursion effecting change of configuration.

2 Claims, 1 Drawing Figure

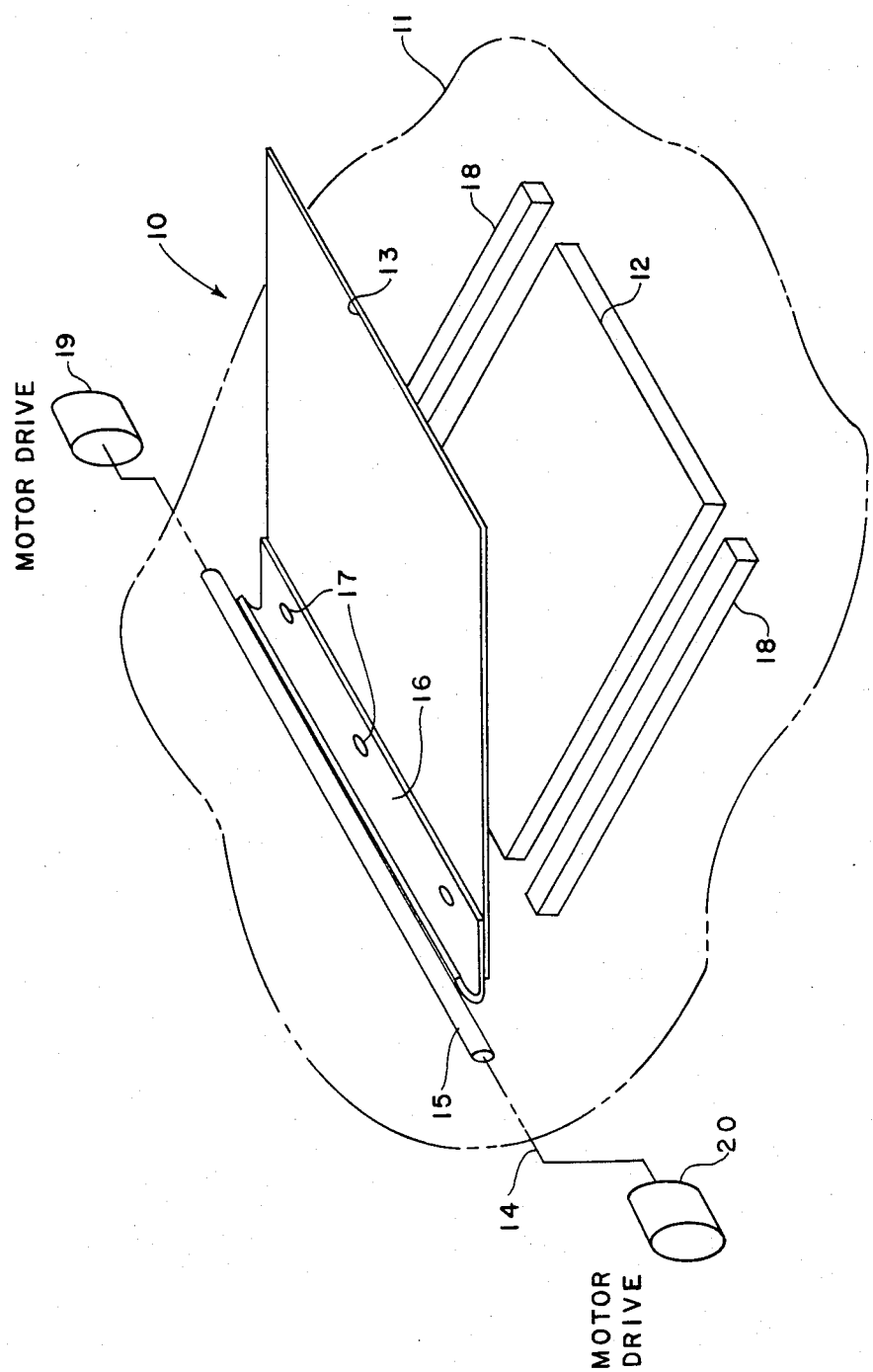

RADIATION PROTECTION LOUVER

RIGHTS OF THE GOVERNMENT

The invention described herein may be manufactured and used by or for the Government of the United States for all governmental purposes without the payment of any royalty.

BACKGROUND OF THE INVENTION

This invention relates to radiation sensitive louvered systems constructed to shield a surface from the effects of rapid onset of high intensity radiation. Louvers of this type find application in space vehicle systems to shield surfaces such as solar cell panels, thermal radiators, and the like, from high intensity radiation.

Previously known devices in the field of the present invention finding substantial use employed thermally sensitive bimetallic elements to serve as the closure means for the louvers. In this application, bimetallic elements may be inadequate principally because they respond in a manner and to a degree substantially proportional to the change in temperature. Substantially immediate and total response of these devices to the onset of radiation is therefore precluded.

The present invention eliminates or substantially reduces in critical importance the aforementioned deficiencies in previously known devices by providing a novel radiation protection louver having a thermally sensitive closure means comprising a hinge of substantially equiatomic martensitic structure alloy, such as titanium nickel. The louver of this invention activates substantially immediately and totally when the transition temperature of the alloy member comprising the hinge is reached, and thereby responds in virtually an on-off mode. By suitable selection of alloy composition, the activation temperature of the louver (transition temperature for the alloy hinge member) may be specifically predetermined over a wide temperature range from about $-50°$ C. to about $166°$ C. The louver of this invention may be reactivated repeatedly, may be applied to shield large surface areas with one or a plurality of louver blades, and may be made to operate independently of other control systems.

It is, therefore, an object of this invention to provide an improved radiation sensitive protective louver system.

It is a further object of this invention to provide a radiation protection louver which responds rapidly upon exposure to high intensity radiation.

These and other objects of the present invention will become apparent as the detailed description of a representative embodiment thereof proceeds.

SUMMARY OF THE INVENTION

In accordance with the foregoing principles and objects of the present invention, an improved radiation protection louver system is described which comprises a movable louver panel hinged to a rotatable shaft through a thermally sensitive closure hinge member comprising a martensitic structure alloy exhibiting the characteristic of changing its shape from an intermediate configuration to a predetermined configuration in response to exposure to high intensity radiation. Motor drive means is included to reshape the hinge to the desired intermediate configuration following a temperature excursion effecting change of configuration.

DESCRIPTION OF THE DRAWINGS

The present invention will be more clearly understood from the following detailed description of a representative embodiment thereof read in conjunction with the accompanying drawing which is an isometric illustration of a louver system in accordance with the present invention.

DETAILED DESCRIPTION

Referring now to the accompanying drawing, a representative embodiment of the novel louver system 10 is shown schematically mounted to a surface 11 of a carrier vehicle or other system (represented by peripheral dashed line) which includes or supports a radiator surface, solar panel or other system 12 for which protection from radiation is desired.

Louver system 10 comprises one or more movable louver blades or panels 13 mounted for rotation substantially about axis 14 of shaft 15. Each panel 13 is mounted to a folded alloy hinge member 16 of substantially equiatomic martensitic structure alloy such as titanium nickel. Panel 13 is riveted, bolted or otherwise conventionally secured to a first side of folded alloy hinge 16 by such as bolts 17 substantially as shown in the drawing. Alloy hinge 16 is secured on the second side to shaft 15 by conventional means in a manner such that the channel defined by the two sides of folded alloy hinge 16 lies generally intermediate shaft 15 and panel 13. Alternatively, an axial slot may be provided in shaft 15 for receiving the second side of alloy hinge 16. Rails 18 may be disposed laterally of the radiator surface 12 to provide any necessary support for the closure of panel 13 and for refolding the alloy hinge 16 as hereinafter described in connection with the operation of louver system 10. The particular configuration and surface area of panels 13 may be selected to conform to the radiator surface 12 configuration to be shielded. Panels 13 may be of any desired shape or may comprise any suitable material having sufficient bend strength to withstand the bending forces required to refold alloy hinge 16 as hereinafter described.

A motor drive, illustrated in the drawing as motor 19, is provided to drive shaft 15 to refold the alloy hinge 16 following a temperature excursion resulting from exposure of the louver system 10 to high energy radiation and consequent closure of panel 13 through the unfolding of alloy hinge 16. A second motor drive 20 may be provided to drive shaft 15 for conventional operation of the louver system, and may be included with motor drive 19 in a single dual purpose motor.

Fabrication of the alloy hinge 16 of the novel radiation protection louver system 10 illustrated in the drawing may be performed in four basic operational steps to impart to the hinge the desired memory. Suitable martensitic alloy material, such as Nitinol, a titanium-nickel alloy, may first be obtained in the desired shape, for example, wire, rod, sheet, tube, extrusion, or casting. The configuration of alloy hinge 16 as illustrated in the drawing comprises a flat strip in its untreated condition, although it is understood that other configurations are suitable within the intended scope hereof. The alloy is then formed or machined into the configuration desired to be remembered, i.e., the shape to which the alloy hinge is desired to return upon heating by exposure to high intensity radiation. In the example shown in the drawing, this shape is a narrow flat strip. The alloy is then clamped into a restraining fixture designed to hold the alloy part in the configuration to be remembered (e.g., a flat strip). The alloy part is then heat treated by heating to above 900° F. and then cooled while restrained in the restraining fixture. The alloy strip is then bent into the desired intermediate configuration, such as the V-shape of alloy hinge 16 of the drawing, and assembled as above described to louver panel 13 and shaft 15.

In use, the louver system 10 as shown in the drawing may operate conventionally through movement of louver panel 13 by activation of motor drive 20. For operation of the system in the high intensity radiation sensitive mode, however, the louver panel 13 may be positioned, for normal operation of radiator system 12, in the open configuration substantially as shown in the drawing. When high intensity radiation impinges upon louver system 10, the temperature may increase sufficiently to transcend the temperature at which the alloy hinge 16 unfolds from its intermediate V-shape to its remembered shape, viz., a flat strip. This results in angular movement of louver panel 13 substantially about axis 14 to a position covering radiator system 12. When the radiation is removed, and alloy hinge 16 cools to below the transition temperature of the alloy, the hinge 16 may be refolded to its intermediate V-shape by activation of motor drive 19. Lateral supports 18 may provide a bearing surface for support of panel 13 to withstand the torque required to refold alloy hinge 16.

The present invention, as hereinabove described, therefore provides an improved radiation sensitive protective louver system. It is understood that certain design modifications and material substitutions may be made, as might occur to one with skill in the field of this invention, within the scope of the appended claims. Therefore, all embodiments contemplated hereunder have not been shown in complete detail. Other embodiments may be developed without departing from the spirit of this invention or from the scope of the appended claims.

We claim:

1. A radiation sensitive protective louver system for shielding a surface from high intensity radiation, comprising:
   a. a shaft mounted for rotation about an axis substantially parallel to said surface;
   b. a movable louver panel mounted for rotation substantially about said axis;
   c. actuator means connecting an edge of said panel to said shaft, for rotating said panel to a position covering said surface in response to heating of said means by high intensity radiation, said means including a metallic alloy member having a predetermined configuration and being formed to an intermediate configuration for installation into said louver system, said alloy member exhibiting the characteristic of changing from said intermediate configuration to said predetermined configuration in response to said heating; and
   d. motor drive means for acting on said shaft to reform said alloy member to said intermediate configuration.

2. The louver system as recited in claim 1 wherein said alloy member comprises martensitic titanium nickel alloy.

* * * * *